United States Patent
Sato et al.

(10) Patent No.: US 6,552,380 B1
(45) Date of Patent: Apr. 22, 2003

(54) SEMICONDUCTOR DEVICE AND MANUFACTURING METHOD THEREOF

(75) Inventors: Tsutomu Sato; Ichiro Mizushima; Yoshitaka Tsunashima, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/531,537

(22) Filed: Mar. 20, 2000

(30) Foreign Application Priority Data

Mar. 19, 1999 (JP) .......................................... 11-075080

(51) Int. Cl.⁷ ............................................ H01L 31/119
(52) U.S. Cl. ........................................ 257/301; 257/313
(58) Field of Search ................................. 257/301, 304, 257/313, 309, 308

(56) References Cited

U.S. PATENT DOCUMENTS

| 5,888,876 A | 3/1999 | Shiozawa et al. |
| 6,100,132 A | 8/2000 | Sato et al. ................... 438/243 |
| 6,180,480 B1 * | 1/2001 | Economikos et al. ....... 438/386 |

FOREIGN PATENT DOCUMENTS

JP        10-56154        2/1998

OTHER PUBLICATIONS

Copy of U.S. Application No. 09/296,669, by Tsutomu Sato et al., entitled "Semiconductor Device and Method of Manufacturing the Same," filed Apr. 22, 1999.
Copy of U.S. Application No. 09/650,748, by Tsutomu Sato et al., entitled "Semiconductor Substrate and its Fabrication Method," filed Aug. 30, 2000.
Copy of U.S. Application No. 09/549,413, by Masaru Kito et al., entitled "Semiconductor Device and Manufacturing Method Thereof," filed Apr. 14, 2000.

* cited by examiner

*Primary Examiner*—Roy Potter
(74) *Attorney, Agent, or Firm*—Finnegan, Henderson, Farabow, Garrett and Dunner, L.L.P.

(57) ABSTRACT

A deep trench is formed in a silicon substrate. The inner surface of the trench is next coated with a thin polycrystalline silicon film (liner film) so as not to close the trench. A silicon germanium film (node electrode) is then formed on the thin polycrystalline silicon film so as not to close the trench. Next, a heat treatment is performed on the silicon germanium film thereby to flow only the silicon germanium so that the trench is filled.

6 Claims, 5 Drawing Sheets

$$R = \frac{\text{RATIO OF MAJOR AXIS DIAMETER / MINOR AXIS DIAMETER AT UPPER PORTION}}{\text{RATIO OF MAJOR AXIS DIAMETER / MINOR AXIS DIAMETER AT LOWER PORTION}} < 1.1$$

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 11-075080, filed Mar. 19, 1999, the entire contents of which are incorporated herein by reference.

BACKGROUND OF THE INVENTION

In accordance with high integration of semiconductor integrated circuits represented by DRAMs, the device area has been reduced from generation to generation. In a DRAM in which each memory cell comprises one transistor and one capacitor, reduction of the device area involves reduction of the area of capacitors for storing information, so the function of storing information is deteriorated.

Hence, in a DRAM, various countermeasures for maintaining a sufficient capacity for the capacitors have been taken so that the information storage function might not be deteriorated by reduction of the device area. Adoption of a capacitor having a three-dimensional structure is one of those countermeasures.

A trench capacitor is known as one of capacitors of this kind. It is important for the trench capacitor to bury a deep trench without causing a void or a seam. FIGS. 6A to 6D are sectional views showing steps of a method for manufacturing a conventional trench capacitor which was proposed to achieve this object (Jpn. Pat. Appln. KOKAI Publication No. 10-56154.)

According to this conventional method, as shown in FIG. 6A, a mask pattern 82 is firstly formed on a silicon substrate 81 and the silicon substrate 81 is etched with the above mask pattern used as a mask by a RIE (Reactive Ion Etching) method, thereby to form a deep trench 83 in the silicon substrate 81. A layered film consisting of a silicon oxide film, a silicon nitride film, and a silicon oxide film can be used for the mask pattern 82.

Next, as shown in FIG. 6B, a collar insulating film 84 is formed, and thereafter, a capacitor insulating film 85 is deposited on the entire surface of the deep trench 83. The collar insulating film 84 is formed as follows.

The inner surface of the trench 83 is oxidized thermally to form a thin oxide film (not shown). Next, a resist (not shown) is applied so as to fill the trench 83 after a silicon nitride film (not shown) having thickness of approximately 10 nm is deposited on the entire surface by a LPCVD method. The resist at an upper portion of the trench is exposed and developed. As a result, an inner wall of the upper portion of the trench is exposed. Next, the resist is peeled after the silicon nitride film and the silicon oxide film at the upper portion of the trench by a CDE method. Further, a side surface of the upper portion of the trench is selectively oxidized thermally with the silicon nitride film at a bottom portion of the trench used as a mask, thereby to form a collar oxide film 84. Next, the silicon nitride film at a lower portion of the trench is peeled by using HF/glycerol. Finally, the silicon oxide film at the lower portion of the trench is removed.

Next, as shown in FIG. 6C, a thin polycrystalline silicon film 86 and an amorphous silicon film 87 containing impurities such as phosphorus or the like are deposited sequentially on the entire surface so as not to close the trench 83.

The thickness of the thin polycrystalline silicon film 86 is, for example, 20 nm. The thin polycrystalline silicon film 86 is used as a liner film and the amorphous silicon film 87 is used a node electrode.

Finally, as shown in FIG. 6D, the amorphous silicon film 87 is subjected to a heat treatment so that the amorphous silicon film 87 flows to fill the trench 83.

This method is to fill the deep trench 83 with the amorphous silicon film 87 without causing any voids or seams, by utilizing the point that the amorphous silicon tends to move more easily than the polycrystalline silicon.

BRIEF SUMMARY OF THE INVENTION

An object of the present invention is to provide a semiconductor device and a method of manufacturing the same having a buried structure (in which a conductive film is buried in a deep trench) which can be realized easily.

To achieve the above object, a semiconductor device according to the present invention is comprises: a silicon substrate having a trench formed in a surface of the silicon substrate; a polycrystalline silicon film coating an inner surface of the trench such that the trench is not closed; and a conductive film made of material having a lower melting point than silicon and formed on the polycrystalline silicon film so as to fill the trench.

Further, a method of manufacturing a semiconductor device, according to the present invention, comprises steps of: forming a trench on a surface of a silicon substrate; coating an inner surface of the trench with a polycrystalline silicon film as a liner film such that the trench is not closed; forming a conductive film made of material having a lower melting point than silicon, on the polycrystalline silicon film, such that the trench is not closed; and flowing the conductive film so as to fill the trench, by performing a heat treatment on the conductive film.

The pressure during the heat treatment is preferably set higher than the pressure at which the conductive film is formed. Further, a heat treatment is preferably performed on the conductive film in a state that no oxide film exists on the surface of the conductive film.

In the present invention, when a trench is buried by a conductive film with a polycrystalline silicon film (liner film) inserted therebetween, the conductive film has a lower melting point than the polycrystalline silicon film. Therefore, in the step of flowing the conductive film by a heat treatment thereby to fill the trench (reflow step), the polycrystalline silicon film and the conductive film can be prevented from flowing integrally. Accordingly, a deep trench can be buried easily with a conductive film having an excellent buried form.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Explained first will be a problem of a conventional method shown in FIGS. 6A to 6D which has been found by the present inventors.

Figure 7:
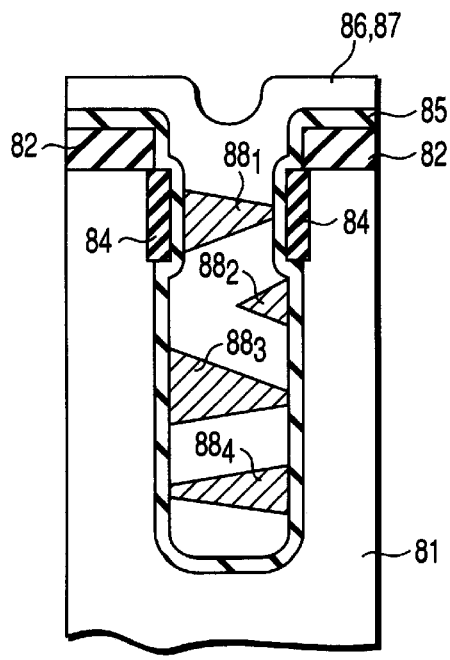
FIG. 7 is a sectional view explaining a problem of the conventional manufacturing method.
Figure 6A:
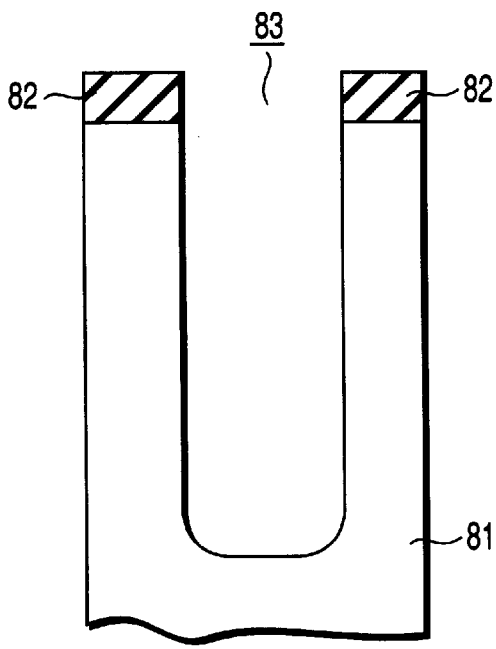
FIGS. 6A to 6D are sectional views showing steps of a conventional method for manufacturing a trench capacitor.
Figure 6B:
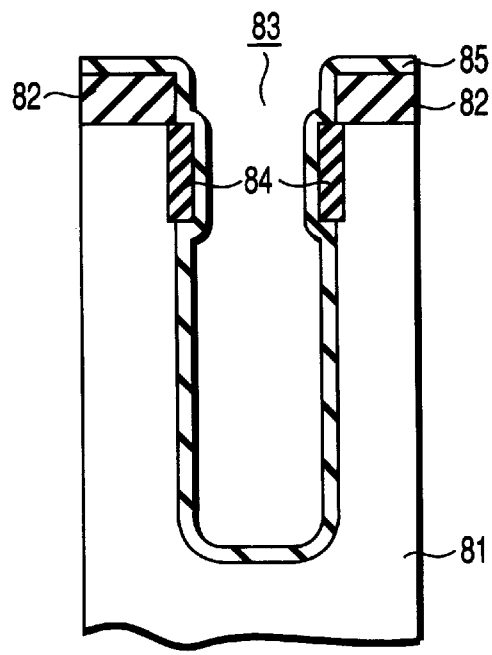
Figure 6C:
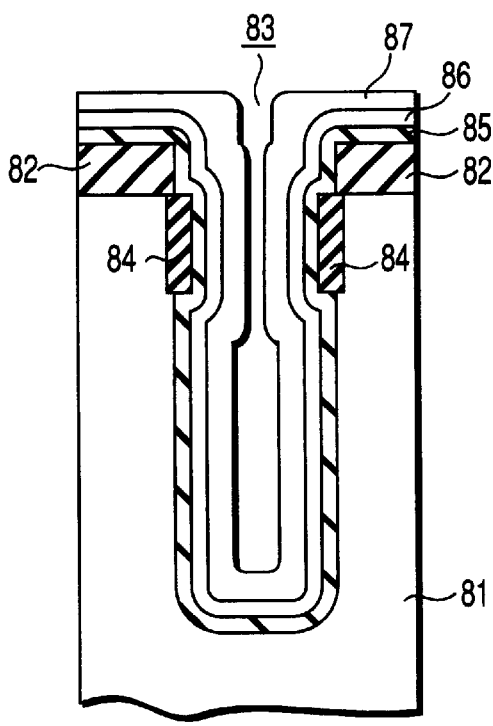
Figure 6D:
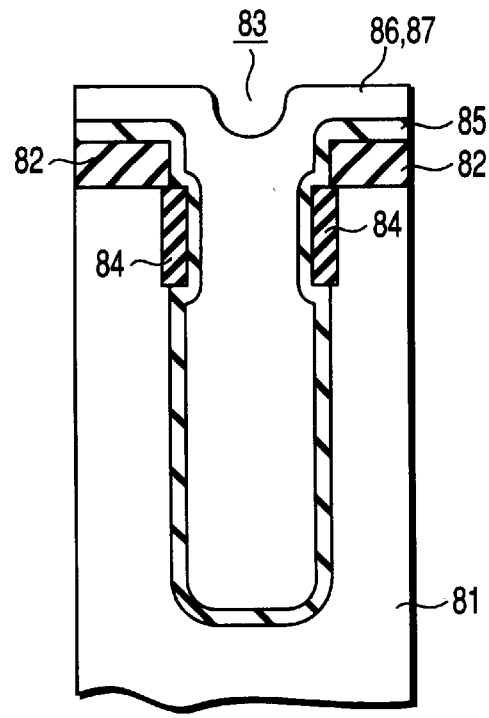

According to studies by the present inventors, it has been clarified that a poly-crystallized amorphous silicon film 87 and a thin polycrystalline silicon film 86 flow integrally in the heat treatment step shown in FIG. 6D and clearances $88_1$ to $88_4$ are formed as a result in the trench 83 as shown in FIG. 7. Particularly, if the aspect ratio of the trench 83 is as high as 10 or more, it is difficult for the conventional method to bury the trench 83 with a silicon film without causing clearances $88_1$ to $88_4$.

The clearances $88_1$ to $88_4$ of this kind cause a problem of increase in resistance of the amorphous silicon film 87 (node resistance). Further, the clearance $88_1$ formed at an upper portion of the trench 83 as shown in the figure acts to separate the upper portion of the amorphous silicon film 87 from the other portions. Consequently, a voltage of a predetermined level cannot be applied to the entire amorphous silicon film 87. In other words, the voltage of a predetermined level is applied to only a part of the amorphous silicon film 87. A problem hence arises in that the clearance $88_1$ reduces a stored charge.

Embodiments of the present invention capable of solving this problem will now be explained with reference to the drawings below.

FIGS. 1A to 1D are sectional views showing steps of a method of manufacturing a trench capacitor according to an embodiment of the present invention.

Figure 1A:
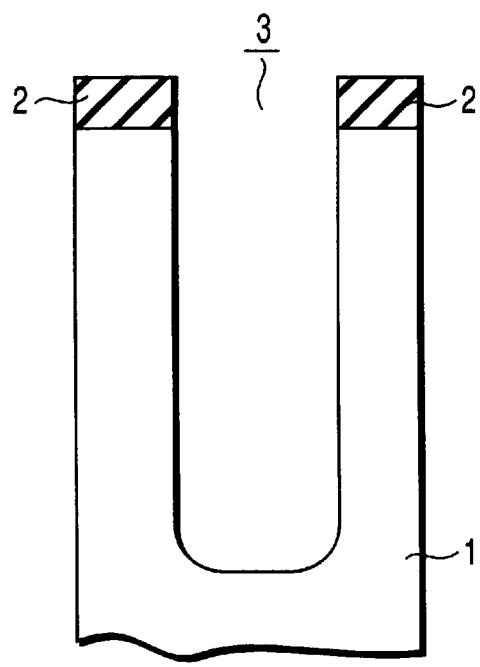
FIGS. 1A to 1D are sectional views showing steps of a method for manufacturing a trench capacitor, according to an embodiment of the present invention.

As shown in FIG. 1A, a mask pattern 2 is formed on a silicon substrate 1, and the silicon substrate is etched by the RIE method with the above mask pattern 2 used as a mask thereby to form a deep trench 3 in the silicon substrate 1.

A layered film consisting of a silicon oxide film, a silicon nitride film, and a silicon oxide film is used for the mask pattern 2. The trench 3 is 6 μm deep and has an aspect ratio of 10 or more.

In this case, a preferable method of forming the trench 3, i.e., the method of forming a trench 3 which has a shape with a round bottom portion as shown in FIGS. 1A to 1D will be as follows.

That is, after forming the trench 3 in a well-known method, the silicon substrate 1 is processed with a hydrogen fluoride aqueous solution to remove a natural oxide film not shown. Subsequently, the silicon substrate 1 is introduced into a chamber, and a heat treatment at 1000° C. for 120 seconds is carried out under condition that only hydrogen flows at 20 slm and the pressure is set to 80 Torr.

At this time, a natural oxide film which is formed again on the surface of the silicon substrate 1 until the silicon substrate 1 is introduced into the chamber is removed, so silicon on the surface of the substrate is exposed. Therefore, such surface diffusion of silicon that minimizes the surface area occurs at the substrate surface. Due to this surface diffusion, the shape of the opening of the trench 3 after the heat treatment becomes such a shape (elliptical shape) that is defined by deforming the shape (rectangular shape) of the opening of the trench 3 immediately after formation thereof so as to increase the minimum value of its radius of curvature. As a result, the bottom portion of the trench 3 is rounded.

Further, according to studies made by the present inventors, it has been found that irregularity caused by RIE on an inner surface of the trench 3 is eliminated by the heat treatment. Therefore, the inner surface of the trench 3 comes to have a smooth shape having little roughness after the heat treatment.

Due to this heat treatment, the shape (a rectangular shape) of the trench 3 at the time of formation is changed into such a shape (an elliptic shape) that increases the minimum value of the radius of curvature, and the irregularity of the inner surface of the trench 3 caused by the RIE is eliminated, so concentration of electric fields can be relaxed. As a result, the withstand voltage can be improved.

Figure 2A:
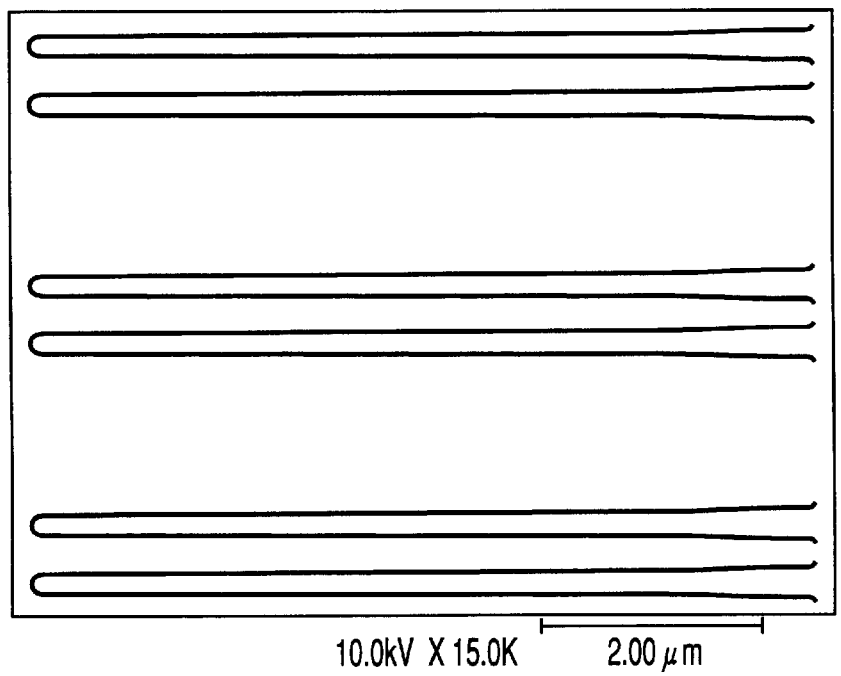
FIGS. 2A and 2B are sectional views showing shapes of a trench before and after a heat treatment.
Figure 2B:
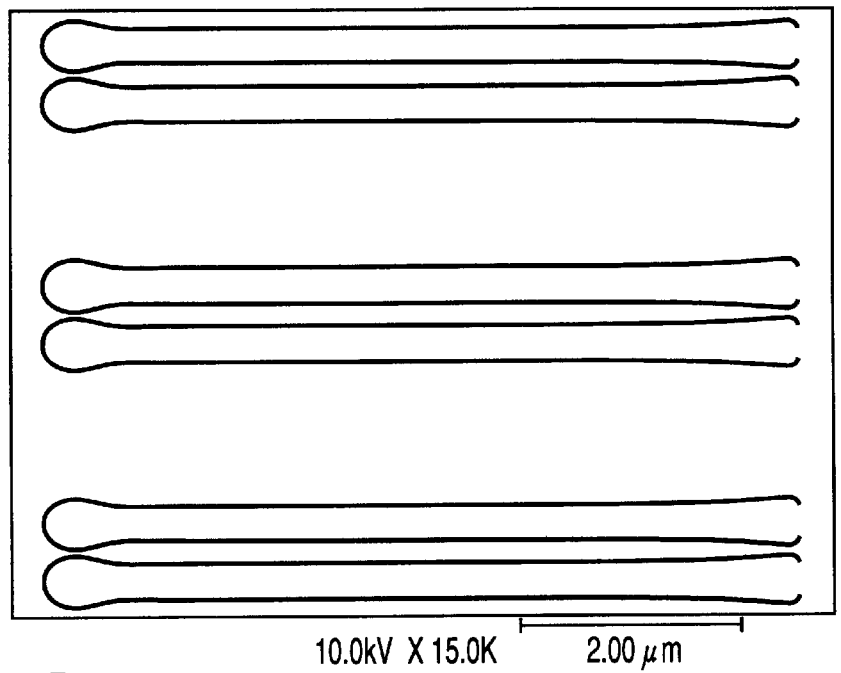

The present inventors have investigated the trench 3 before and after deforming the shape of the trench by the heat treatment under a decompressed condition as described above by a cross-sectional SEM. As a result, as shown in FIG. 2A, it was found that the shape of trench 3 becomes narrower as the RIE proceeds deeper. However, as shown in FIG. 2B, it was also found that the trench 3 is deformed to have such a region in which the cross-sectional area is larger at a position closer to the bottom in the bottom portion of the trench. Owing to this deformation, it is possible to obtain securely a larger capacitor area than that of a conventional device.

Figures 3A, 3B, 3C:
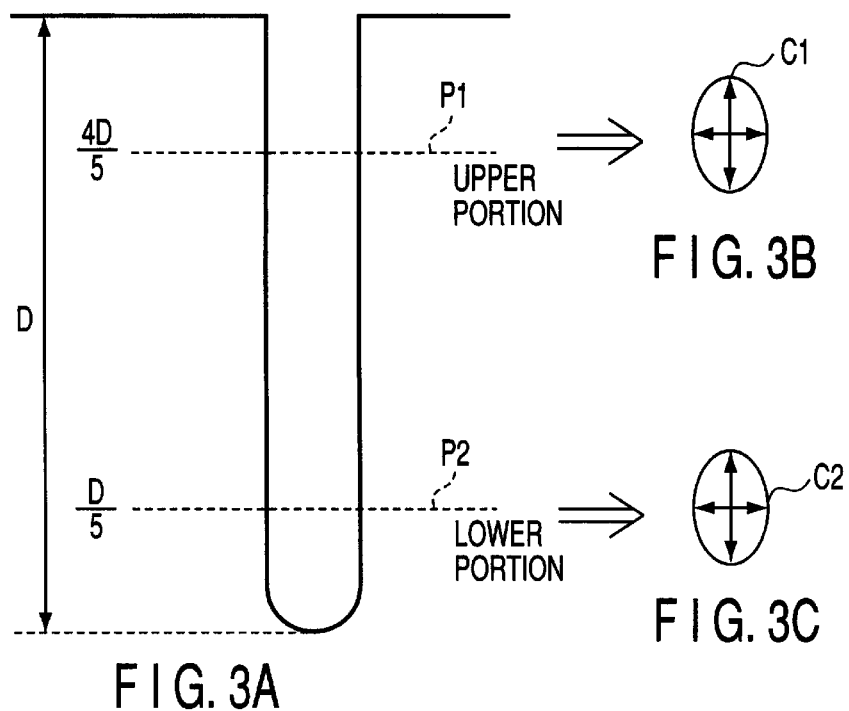
FIGS. 3A to 3C are views explaining characteristics of shapes of a trench before and after a heat treatment.

Further, according to studies made by the present inventors, it has been also found that the following is given if the shape of the trench 3 is deformed by the heat treatment under the decompressed condition as described above. Suppose that a first cross-section C1 is a cross-section where the trench 3 is cut along a first plane P1 having a normal line parallel to the depth direction of the trench, at a position distant by 4D/5 (D is the depth of the trench 3) from the bottom of the trench 3, and that a second cross-section C2 is the cross-section where the trench 3 is cut along a second plane P2 having a normal line parallel to the depth direction of the trench 3, at a position distant by D/5 from the bottom of the trench 3, as shown in FIGS. 3A to 3C. A value R2 which is obtained by dividing the major axis diameter of the second cross-section C2 by the minor axis diameter thereof is smaller than 1.1 times the value of R1 which is obtained by dividing the major axis diameter of the first cross-section C1 by the minor axis diameter thereof.

In this case, a hydrogen fluoride aqueous solution is used for a preliminary treatment (removal of a natural oxide film). However, in case where a thin oxide film of approximately 1.5 nm is formed with a mixed solution of hydrochloric acid water and ozone water, the thin oxide film can be removed together with the natural oxide film by a later heat treatment in the chamber. It is therefore possible to obtain the same effect as in the case of using the hydrogen fluoride aqueous solution.

The pressure and temperature in the chamber are set to 80 Torr and 1000° C. during the heat treatment for deforming the shape of the trench. However, since surface diffusion of silicon occurs at 850° C. or more under a decompressed condition, the shape of the trench can be deformed likewise in this case.

The surface diffusion of silicon appears more clearly and the trench 3 causes larger deformation of shape as the pressure and the temperature respectively become lower and higher. Further, if the temperature is higher than 1200° C., there occurs a phenomenon that the bottom portion of the trench 3 is split. Therefore, the temperature of the heat treatment for causing surface diffusion of silicon must be set to 1200° C. or less.

It has been known that the surface diffusion of silicon is suppressed by a heat treatment in a gas atmosphere in which a hydrogen gas and a $PH_3$ gas are let flow simultaneously. Accordingly, in case where only the $PH_3$ gas is let flow first and only the hydrogen gas is let flow next, the shape of the trench does not change while doping P and the shape obtained at the time point when only the hydrogen gas is let flow is maintained even after the doping of P.

The above explanation has been made of a case where a hydrogen gas is let flow to cause surface diffusion of silicon. However, it is not always necessary to flow a hydrogen gas, and a flow phenomenon occurs as long as the pressure is reduced.

To cause a flow effectively, it is preferable that the surface of the silicon substrate 1 is oxidized and a heat treatment is carried out in an environment that the partial pressures of an oxygen gas and a water vapor which act to suppress surface diffusion of silicon are low.

However, if a hydrogen gas is let flow as described above, the reaction that silicon is oxidized into $SiO_2$ is suppressed and tends to decrease due to deoxidation action of hydrogen, and therefore, silicon can easily be flowed.

That is, even in an environment that the partial pressures of the oxygen gas and the water vapor are not low, surface diffusion of silicon is possible if deoxidation proceeds in oxidation-deoxidation reaction between silicon and $SiO_2$.

Figure 1B:
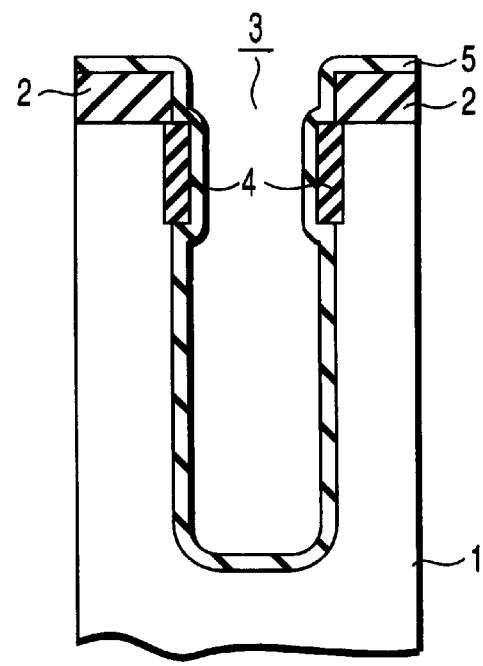

Next, as shown in FIG. 1B, a collar insulating film 4 is formed in a well-known method, and thereafter, a capacitor insulating film 5 is deposited on the entire surface. A silicon oxide film or silicon nitride film is used as the collar insulating film 4.

Figure 1C:
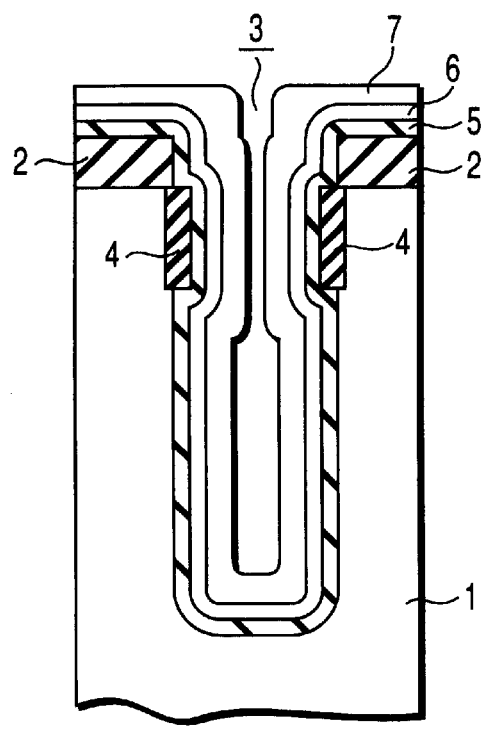

Next, as shown in FIG. 1C, a thin polycrystalline silicon film 6 as a liner film is deposited on the entire surface such that the trench 3 is not closed. The thickness of the thin polycrystalline silicon film 6 is 20 nm, for example. A LPCVD method which is a kind of CVD method with excellent coating quality may be used as a film forming method.

The film forming condition for the thin polycrystalline silicon film 6 is as follows. That is, the temperature and pressure are respectively set to 600° C. and 0.3 Torr, and silane ($SiH_4$) is used for a raw material gas.

Thereafter, as shown in FIG. 1C, a silicon germanium film 7 containing phosphorus, arsenic or boron is deposited as a node electrode on the thin polycrystalline silicon film 6, for example, by the LPCVD method such that the trench 3 is not closed. Although the silicon germanium film 7 is preferably amorphous, this film 7 may be polycrystalline.

Figure 4:
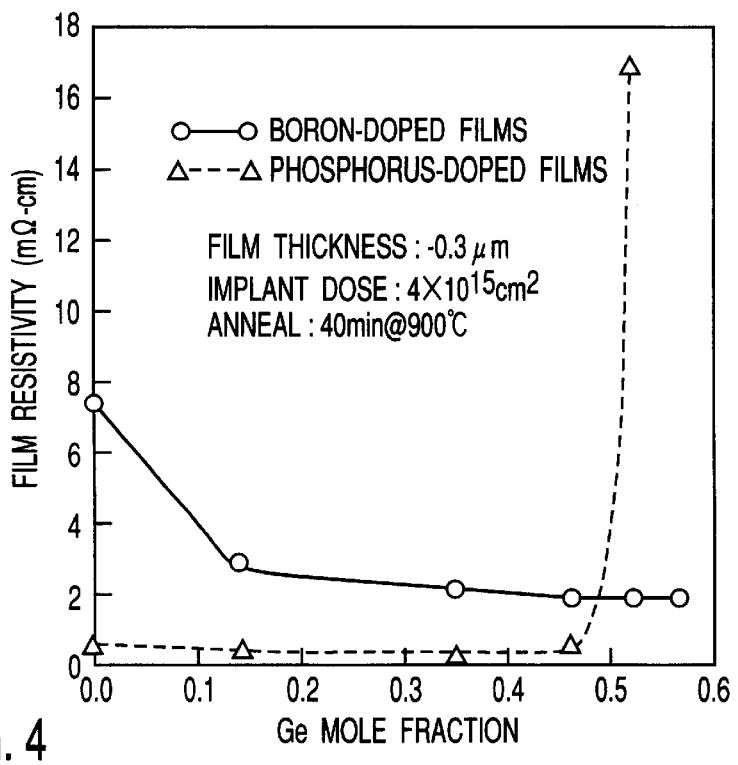
FIG. 4 is a view showing a relationship between the resistance rate of a silicon germanium film applied with boron or phosphorus and the germanium ratio.

The relationship between the resistance rate (mΩ cm) of the silicon germanium film 7 and the ratio of germanium differs depending on the dopant to be applied. For example, as shown in FIG. 4, in case where the dopant is phosphorus, the resistance rate of $Si_{1-X}Ge_X$ film increases rapidly if the composite ratio X exceeds 4.5. In contrast, if the dopant is boron, the resistance rate does not substantially change but is maintained at a low value if the composite ratio X exceeds 1.5 or above.

Therefore, if priority is given to reduction of the resistance rate, a silicon germanium film 7 applied with phosphorus and having a germanium composite ratio of 5.5 or less may be used. In order to facilitate control of the application amount of a dopant, a silicon germanium film 7 applied with boron and having a germanium composite ratio of 1.5 or more may be used.

Figure 1D:
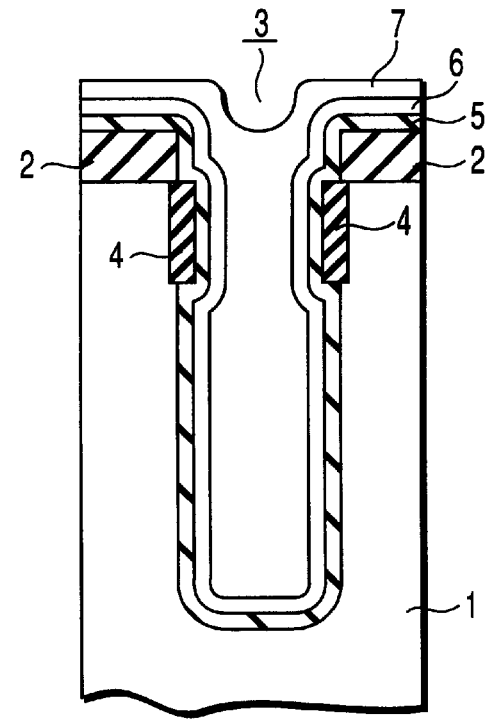

Next, as shown in FIG. 1D, the silicon germanium film 7 is flowed to fill the trench 3 by performing a heat treatment on the silicon germanium film 7. If an undoped silicon germanium film 7 is formed in the step shown in FIG. 1C, a dopant is applied by ion implantation after the silicon germanium film 7 is flowed in the present step.

To flow the silicon germanium film 7 effectively, the temperature and pressure in the heat treatment are set higher than those in the film formation of the silicon germanium film 7. Specifically, the temperature of the heat treatment is 750 to 950° C., and the temperature of the film formation of the silicon germanium film 7 is 550 to 650° C.

If the film formation temperature and the heat treatment temperature are thus selected, an amorphous silicon germanium film 7 is formed in the step of FIG. 1C and is thereafter changed into a polycrystalline silicon film 7 in the later step of FIG. 1D. Note that the silicon germanium film 7 can be flowed even if the temperature and the pressure are set higher.

The amorphous silicon germanium film 7 excels the polycrystalline silicon film 7 in the step coverage. Therefore, in case where the aspect ratio of the trench 3 is as high as 10 or more like in the present embodiment, the amorphous silicon germanium film 7 should preferably be formed first as described above.

To flow the silicon germanium film 7 effectively, the heat treatment may be carried out under the condition of the temperature and pressure described above in a state that an oxide film does not substantially exist on the surface of the silicon germanium film 7. To do so, it is important that influence from oxygen and water vapor is reduced sufficiently. Accordingly, a preferable atmosphere for the heat treatment should be an atmosphere such as a hydrogen atmosphere which effects deoxidation or an inactive gas atmosphere of Ar or the like in which the partial pressures of oxygen and water vapor are sufficiently low during the heat treatment. It is also preferable that the partial pressure of water vapor ($P_{H20}$) is lower than $10_{-10}$ (=$P_{H20}/P_{H2}$) with respect to the partial pressure of hydrogen ($P_{H2}$). The smaller the value of $P_{H20}$ is, i.e., the smaller the value of $P_{H20}/P_{H2}$ is, the more difficult the oxidation is.

Figure 5:
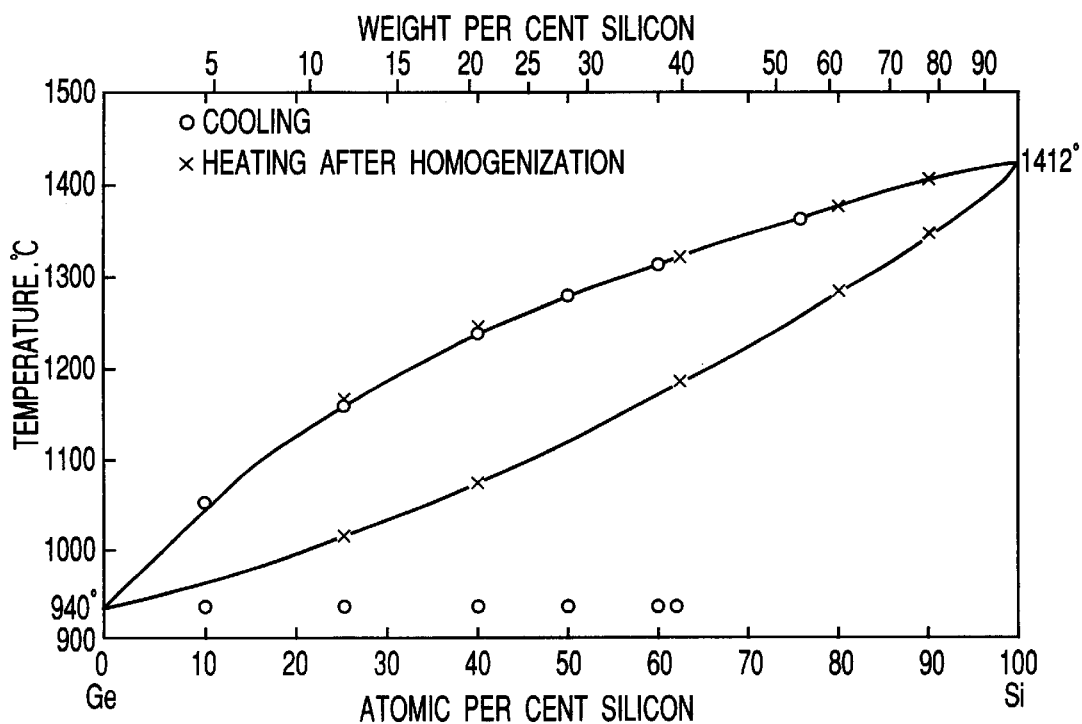
FIG. 5 is a view showing the dependency of the melting point of $Si_xGe_{1-x}$ ($0 \leq x \leq 1$) on the silicon ratio.

FIG. 5 shows the dependency of the melting point of $Si_XGe_{1-X}$ (0≦x≦1) on the silicon ratio (H. Stroeand W. Klemm, Z. anorg. Chem., vol. 24, 1939, p 305–323).

As shown in the figure, silicon (x=1) has a melting point of 1412° C., and germanium (x=0) has a melting point of 940° C. Silicon germanium (x≠0, 1) has melting points of silicon and germanium. Therefore, the silicon germanium film can be flowed by a heat treatment at a lower temperature than the silicon film.

Accordingly, in the heat treatment step shown in FIG. 1D, the thin polycrystalline silicon film membrane 6 acts as an appropriate liner film with respect to the silicon germanium film 7 and only the silicon germanium film 7 can be flowed. As a result, the inside of the trench 3 can be buried easily without causing a void, a crack (seam), or clearances $88_1$ to $88_4$ as shown in FIGS. 6A to 6C.

Thus, according to the present embodiment, the inside of a deep trench 3 can be buried easily without causing a void, a crack (seam), or clearances, by coating the inner wall of the deep trench 3 with a thin polycrystalline silicon film 6, depositing thereafter a silicon germanium film 7, and performing a heat treatment on the silicon germanium film 7. As a result, increase of the node resistance and decrease of stored charges can be suppressed.

The present invention is not limited to the above embodiment. For example, the present invention is effective for a capacitor which does not have a collar insulating film.

Although only the case of a trench capacitor has been explained in the above embodiment, the present invention is particularly effective for a trench capacitor having a deep trench with a high aspect ratio, e.g., a trench capacitor forming part of a memory cell in a DRAM.

Although the above embodiment uses a silicon germanium film, similar effects can also be obtained by using a germanium film. It is only necessary that a conductive film having a lower melting point than a thin polycrystalline silicon film be used as a node electrode.

Although the above embodiment explains a case of applying the present invention to a trench of a capacitor, the present invention is also applicable to a trench for STI (Shallow Trench Isolation).

In the above embodiment, deposition of a silicon germanium film and a heat treatment thereof are carried out only once. The inside of the trench may be buried by repeating the deposition and heat treatment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a silicon substrate having a trench formed in a surface of the silicon substrate, the trench having an opening end of a rounded shape, a rounded bottom portion, and an opening of the rounded shape between the opening end and the rounded bottom portion;
   a polycrystalline silicon film coated on an inner surface of the trench such that the trench is not closed; and
   a conductive film made of material having a lower melting point than silicon and formed on the polycrystalline silicon film so as to fill the trench.

2. A semiconductor device according to claim 1, wherein the conductive film is a node electrode of a trench capacitor.

3. A semiconductor device according to claim 1, wherein the material is either silicon germanium or germanium.

4. A semiconductor device according to claim 1, wherein the conductive film is a $Si_{1-X}Ge_X$ film (X>1.5) containing boron.

5. A semiconductor device according to claim 1, wherein the conductive film is a $Si_{1-X}Ge_X$ film (X<0.45) containing phosphorus.

6. A semiconductor device according to claim 1, wherein an aspect ratio of the trench is 10 or more.

* * * * *